United States Patent
Ishizuka

(10) Patent No.: US 7,419,885 B2
(45) Date of Patent: Sep. 2, 2008

(54) METHOD FOR CUTTING A WAFER USING A PROTECTION SHEET

(75) Inventor: Masaharu Ishizuka, Nagano (JP)

(73) Assignee: TDK Corporation, Tokyo (JP)

( * ) Notice: Subject to any disclaimer, the term of this patent is extended or adjusted under 35 U.S.C. 154(b) by 425 days.

(21) Appl. No.: 11/271,740

(22) Filed: Nov. 14, 2005

(65) Prior Publication Data

US 2006/0189100 A1    Aug. 24, 2006

(30) Foreign Application Priority Data

Nov. 16, 2004    (JP)    ............................. 2004-331630

(51) Int. Cl.
*H01L 21/46*    (2006.01)
*H01L 21/78*    (2006.01)
*H01L 21/301*    (2006.01)

(52) U.S. Cl. ............... 438/460; 438/113; 257/E21.237; 257/E21.347; 257/E21.499

(58) Field of Classification Search ................ 438/460, 438/113, 68, 55, 57, 64, 8, 106, 118, 122, 438/124, 712, 780
See application file for complete search history.

(56) References Cited

U.S. PATENT DOCUMENTS

| | | | | |
|---|---|---|---|---|
| 5,294,381 A | * | 3/1994 | Iguchi et al. | 264/25 |
| 5,308,708 A | * | 5/1994 | Takeda et al. | 428/610 |
| 5,495,126 A | * | 2/1996 | Iguchi et al. | 257/717 |
| 5,855,998 A | * | 1/1999 | Tanabe et al. | 428/216 |
| 6,193,585 B1 | * | 2/2001 | Tanabe et al. | 451/41 |

FOREIGN PATENT DOCUMENTS

| | | |
|---|---|---|
| JP | 06-151265 A | 5/1994 |
| JP | 10-092778 A | 4/1998 |
| JP | 2002-270676 A | 9/2002 |

* cited by examiner

*Primary Examiner*—David Nhu
(74) *Attorney, Agent, or Firm*—Oliff & Berridge, PLC

(57) ABSTRACT

The method for dicing a wafer including the steps of: reducing a thickness of a wafer to at least 0.1mm or less; forming a protection sheet tightly on one side of the wafer, the protection sheet having a Vickers hardness of 2 or more; and dicing the wafer by a grindstone, the wafer having the protection sheet thereon.

12 Claims, 9 Drawing Sheets

METHOD FOR CUTTING A WAFER USING A PROTECTION SHEET

This Application is an U.S. Nonprovisional Utility Patent Application that claims priority from Japanese Patent Application No. 2004-331630 filed Nov. 16, 2004, the complete disclosure of which is incorporated herein by reference.

BACKGROUND OF THE INVENTION

1. Field of the Invention

The present invention relates to a method for dicing a wafer, particularly to a method for dicing and separating a thin wafer in the process of manufacturing, for example, a non-contact type IC card.

2. Description of the Related Art

Silicon wafers of the thin film type have been used in a variety of fields, such as in the field of manufacturing a non-contact type IC card. Non-contact type IC cards have been used in a lot of fields, such as the application to ticket gates of railroads, and are expected to be applied in a lot of fields in the future. A non-contact type IC card has an antenna, a semiconductor chip (IC chip), and a sheet material to cover the antenna and the IC chip. Silicon wafers of the thin film type are also used for the manufacturing of cellular phones and various types of sensors.

The reasons for using thin silicon wafers in these products are as follows. The thickness of a wafer is related to the thickness of IC cards which are to be produced when a wafer is used for IC cards. Moreover, thin silicon wafers are advantageous because of their flexibility which allows them to be bent without causing any damage during use. ICs, when applied to cellular phones, need compact and three-dimensional mounting within a small space by methods such as piggyback stacking. For these reasons, IC chips are required to be processed as thin as possible. ICs, when applied to, for example, sensors, are required to be processed thin to ensure mounting of the chips, as well as to ensure a reduction in chip size.

An IC chip consists of a chip portion, which has a base plate made of stacked films of silicon etc. to form circuits thereon, and a reinforcing plate, which is normally made of stainless steel, to support the chip portion. The reinforcing plate has the function of protecting the chip portion against excessive deformation and of a heat sink which absorbs heat that is generated in the chip portion.

Various methods for manufacturing an IC chip have been proposed. According to a known art, deep grooves are formed in a wafer prior to dicing the wafer. In this method, first, deep grooves are formed along the chip to a depth that is larger than the thickness of the finished wafer. Next, the wafer is attached to a base plate via an adhesive tape or wax that is applied on the base. The wafer is then ground to a predetermined thickness from the back side of the wafer to separate the wafer into chips. However, there are some drawbacks in this method because of the internal stress and internal distortion which are induced within the wafer due to the machining on the side which is ground. First, the chips are more apt to have cracks due to external forces. Secondly, as the chips become thinner, their characteristics, as an element, tend to be more affected. In particular, the characteristics may be significantly deteriorated when the chip is used for, for example, as a magnetic sensor. Furthermore, as chips become smaller, chips tend to peel from the base plate during grinding, or tend to experience chipping because of the vibration and displacement during grinding. The term 'chipping' means a crack in a wafer along a dicing line.

Therefore, another process may be used in which a wafer is diced into chips after the wafer is made thinner. In this method, a wafer having a plurality of chip portions thereon is made thinner from the back side of a wafer, and then the thin wafer is diced into individual chip portions. Finally, the separated chip portions are attached to reinforcing plates in order to manufacture IC chips.

Specifically, this method is carried out in accordance with the following steps. First, a wafer is attached to a base plate, and then ground without being separated into chips at this step.

The surface may be etched after grinding in order to remove the distortion that is generated on the surface through the machining process. Etching may be performed through wet etching using fluoro-acid etc., or through milling in a vacuum, or through reactive etching in a vacuum such as RIE. However, in this method, it is not desirable to form grooves first for the following reasons. In a wet process, as well as in the reactive etching process, the etching solution may flow out to the opposite side of the wafer, causing damage on the surface of the elements. In a physical etching process such as milling, the elements are more apt to be damaged by the heat that is generated during milling. Removing the stress by means of etching etc. using such a process after the wafer is made thinner facilitates obtaining flat chips after the chips are removed from the base plate. In this way, chips are uniformly attached onto base plates, such as heat sinks, and become more resistant to cracks which are generated by external forces. When the elements are used, for example, as sensors, their characteristics, as an element, are less affected.

Next, a plastic sheet made of polyester or the like is placed on a dicing base. The plastic sheet is then fixed on the dicing base with the help of negative pressure on the back side of the plastic sheet. Next, resin, such as ultraviolet curing resin or thermosetting resin, is applied on the plastic sheet, as shown in the specifications etc. of Japanese Patent Laid-open Publication No. 2002-270676 and 92778/98. Such a stacked structure formed in this manner consisting of the plastic sheet and the resin is called a processing tape.

The reason for applying resin on a wafer is as follows. A wafer, which is diced along the boundaries between the chip portions, has an exposed portion of the base plate made of silicon etc. along the boundaries, and terminals for inspection on the back side of the chip portions, and the brittleness of the terminals and the base plate facilitates the occurrence of chipping. Although the chip portion is covered with a protective film made of materials such as polyimide, foreign substances, such as gas or water, will invade the chip portion to cause corrosion, when chipping at the boundary reaches the protective film. Moreover, the concentration of chipping may lead to stress concentration, which causes cracks which grow from the location of the chipping during temperature cycles and which result, in the worst case, in the fracture of the element. For this reason, it is important to prevent the chipping while dicing a wafer. The application of resin, such as ultraviolet curing resin or thermosetting resin, reduces resistance against dicing, which may cause chipping, and also stabilizes (prevents the deflection of) the wafer and the grindstone during dicing. In addition, removal of resin, which becomes unnecessary after dicing, can be facilitated.

Next, the processing tape is held by a fixing device, called a dicer ring, and stretch (tension) is applied to the processing tape in order to prevent air from entering the space between the dicing base and the processing tape, and thereby to make the processing tape flat. Next, a wafer is attached to the processing tape on the side of the resin. These processes can be automatically performed by special equipment called a mounter.

Next, the wafer having the processing sheet thereon is diced by a grindstone which has abrasive grains made of, for example, artificial diamond. The chipping depends largely on the particle size (The particle size is the index of the particle diameter of grains in a grindstone. A grain size number means the density of grains per one square inch. The grain size number is in proportion to the number of the grains, and is in inverse proportion to the diameter of the particle.) A grindstone with large particle diameters tends to get stuck in a wafer and to cause chipping because of the large resistance against dicing. Thus, in general, a grindstone having particles with small diameters, or particles with large particle number, is used to dice a thin wafer, which is apt to have chipping. In the field of semiconductors, grindstones with a grain size number between 2000s and 4000s are used.

The processing sheet is peeled after dicing the wafer. In order to peel the processing sheet, according to a disclosed method, a needle is stuck to the back surface of the processing sheet in order to partially separate the chip portion from the processing sheet, and then the chip portion is picked up by vacuum tweezers etc. See, for example, the specification etc. of Japanese Patent Laid-open Publication No. 151265/94.

Thus, the method of dicing a wafer into chips after making the wafer thinner, which enables improvement in the reliability and uniformity in the characteristics of the separated chips, has been used more frequently in line with the trend toward reduced chip size and increased chip density.

Recently, a dicing technology which uses laser also has been widely studied.

However, there are the following drawbacks in prior art. Specifically, wafers have become increasingly thinner in recent years as mentioned above. However, as a wafer becomes thinner, a wafer is apt to move up and down during dicing, and the grindstone experiences unstable movement, resulting in the increased possibility of fine cracks, i.e., chipping. The result is the same even if a protection tape mentioned above is used. Furthermore, a wafer the surface of which is etched after being made thinner, becomes significantly less resistant against peeling during dicing, because the capacity to hold the wafer during dicing, which is due to the thickness of the base plate, is weakened. If a wafer is attached to a base plate with a tougher adhesive in order to improve resistance against peeling, removal of chips becomes more difficult, resulting in a significant reduction in yield in the separating process after dicing, as well as resulting in damage to the chips.

Grindstones with larger grain size numbers may be used in order to reduce the resistance against dicing. However, the method is economically disadvantageous, because grindstones become more expensive as the grain size number is increased. Alternatively, resistance against dicing can be suppressed by reducing dicing speed, i.e., by reducing dicing speed to an extremely low speed at first (for example, about 5 mm/sec), then by gradually increasing the dicing speed while checking the dicing condition to confirm whether there are problems or not. However, this method worsens working efficiency because of the need to check the dicing condition and because of the low average dicing speed.

In addition, the method for dicing a wafer that uses a laser is disadvantageous in that the heat generated during irradiation may damage a wafer, especially a thin wafer.

Thus, there remain major problems of how to prevent chipping when a thin wafer is diced. It is pointed out that the problem of chipping becomes significant especially for a wafer that is less than 0.1 mm in thickness, as mentioned, for example, in the specification etc. of Japanese Patent Laid-open Publication No. 2002-270676.

Moreover, because tension in the processing tape and in the resin film as well, that is given after the application of resin, is released such that the resin film deforms to shrink locally as soon as the resin film is diced, the dicing plane of a wafer moves during dicing, causing, in the worst case, cracks on the wafer or on elements formed on the wafer.

SUMMARY OF THE INVENTION

It is the object of the present invention to provide a method for dicing a thin wafer, which is economical and is able to suppress chipping. In other words, the present invention provides a method for dicing a wafer into chips which allows easy separation of a wafer into chips and improves productivity, while significantly reducing damage to the chips when dicing a wafer into chips.

According to one embodiment of the present invention, a method for dicing a wafer comprising the steps of: reducing a thickness of a wafer to at least 0.1 mm or less; forming a protection sheet tightly on one side of said wafer, said protection sheet having a Vickers hardness of 2 or more; and dicing said wafer by a grindstone, said wafer having said protection sheet thereon.

A wafer is reinforced by a protection sheet with a predetermined hardness, and thus the rigidity of the wafer is increased. Thus, deformation of the wafer is limited, and the grindstone can stably advance along dicing lines. Therefore, a wafer with a thickness of 0.1 mm or less, which is more apt to have chipping, can be stably diced along dicing lines.

The step for forming the protection sheet may comprise the steps of: applying a film which consists of thermosetting resin tightly on said wafer; and heating and curing said film to obtain said protection sheet, said film being tightly applied.

The step for applying the film may comprise the steps of: applying said film which consists of thermosetting resin on a processing tape, said processing tape having a stacked structure of a base material and a resin film, wherein said film which consists of thermosetting resin is applied on the resin film; and applying said film which consists of thermosetting resin on said wafer, said film being formed on said processing tape.

The step for applying the film may comprise the steps of: forming the film which consists of thermosetting resin on said wafer: and attaching said wafer on a processing tape having a stacked structure of a base material and a resin film, said wafer having said film which consists of thermosetting resin formed thereon, wherein a side of said wafer on which the film which consists of the thermosetting resin is formed and a side of said processing tape on which the resin film is formed are attached tightly.

Preferably, no tension is applied to said processing tape in said step for applying the film.

The thermosetting resin may be epoxy resin.

The step for forming the protection sheet may comprise the steps of: applying a film which consists of ultraviolet curing resin tightly on said wafer; and irradiating ultraviolet rays and curing said film to obtain said protection sheet, said film being tightly applied.

The step for applying the film comprises the steps of: applying said film which consists of ultraviolet curing resin on a processing tape, said processing tape having a stacked structure of a base material and a resin film, wherein said film which consists of ultraviolet curing resin is applied on the resin film; and applying said film which consists of ultraviolet curing resin on said wafer, said film being formed on said processing tape.

The step for applying the film may comprise the steps of: forming the film which consists of ultraviolet curing resin on said wafer: and attaching said wafer on a processing tape having a stacked structure of a base material and a resin film, said wafer having said film which consists of ultraviolet curing resin formed thereon, wherein a side of said wafer on which the film which consists of the ultraviolet curing resin is formed and a side of said processing tape on which the resin film is formed are attached tightly.

Preferably, no tension is applied to said processing tape in said step for applying the film.

Further, the method may comprise the step of processing the grindstone by a processing grindstone prior to said step for dicing said wafer, wherein said processing grindstone has grains having particle diameters which are less than that of the grindstone, and having hardness which is equal to or lower than that of the grindstone. Specifically, the processing grindstone preferably has the grains having particle diameters which are 0.01 mm on average and range between 0.008-0.012 mm, and having the hardness which is 13 or more according to modified Mohr's scale of hardness.

As explained above, according to the method for dicing a wafer of the present invention, a wafer with a thickness of 0.1 mm or less, which is more apt to have chipping, can be diced successfully by reinforcing the wafer with a protection sheet. Consequently, because of the improved yields and the higher dicing speed, an improved manufacturing efficiency can be achieved. Moreover, the economical advantage can also be enhanced, because expensive dicing devices, such as a laser device, are not required.

The above and other objects, features and advantages of the present invention will become apparent from the following description with reference to the accompanying drawings which illustrate examples of the present invention.

DETAILED DESCRIPTION OF THE INVENTION

Figure 1:
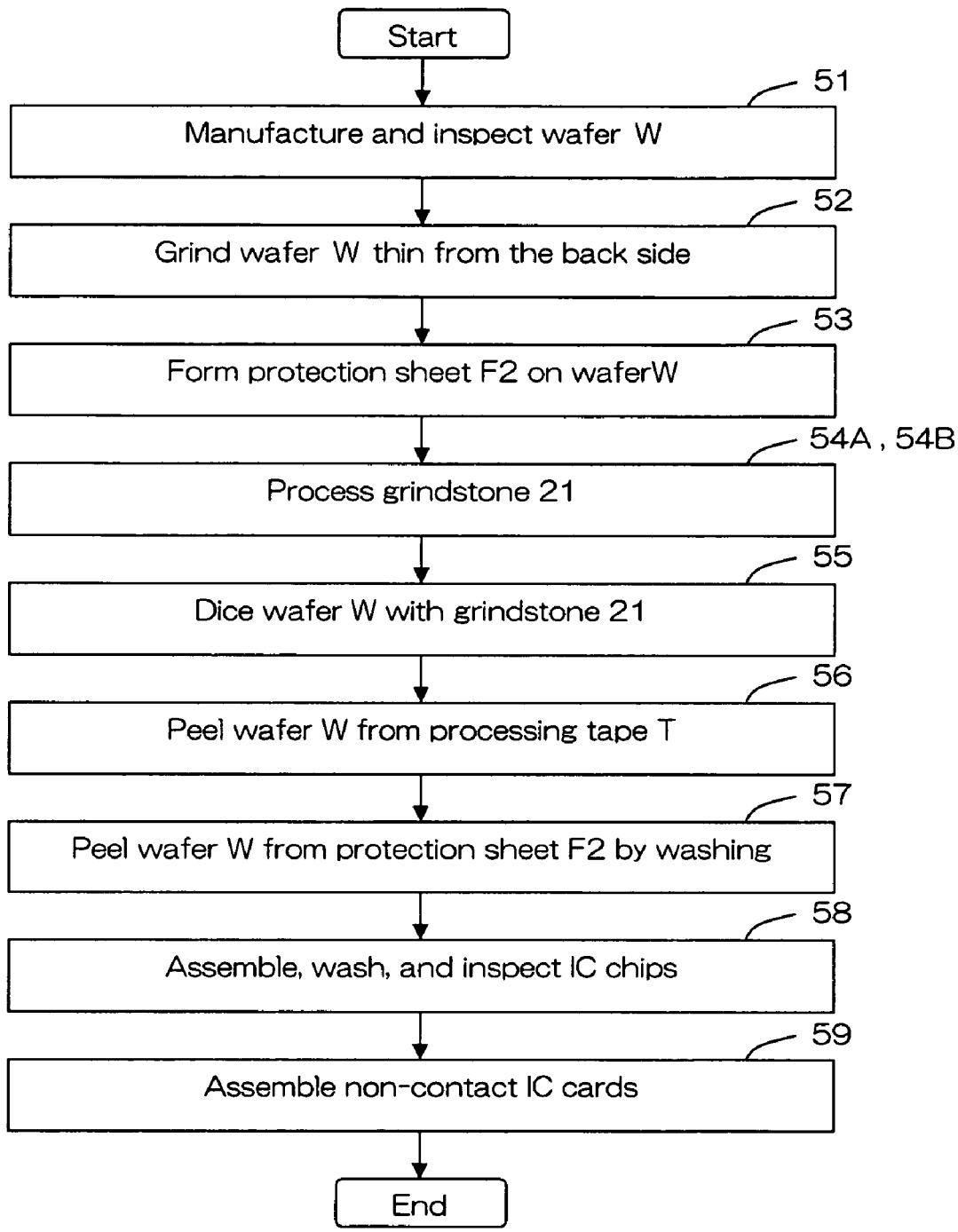
FIG. 1 is a flow chart showing a method for dicing a wafer according to the present invention.

A method for dicing a thin film according to the present invention will be explained with reference to the flow chart shown in FIG. 1, taking a method for manufacturing a non-contact type IC card as an example.

(Step 51) First, wafer W that has silicon base plate K with a plurality of chip portions C formed thereon is manufactured.

Figure 2:
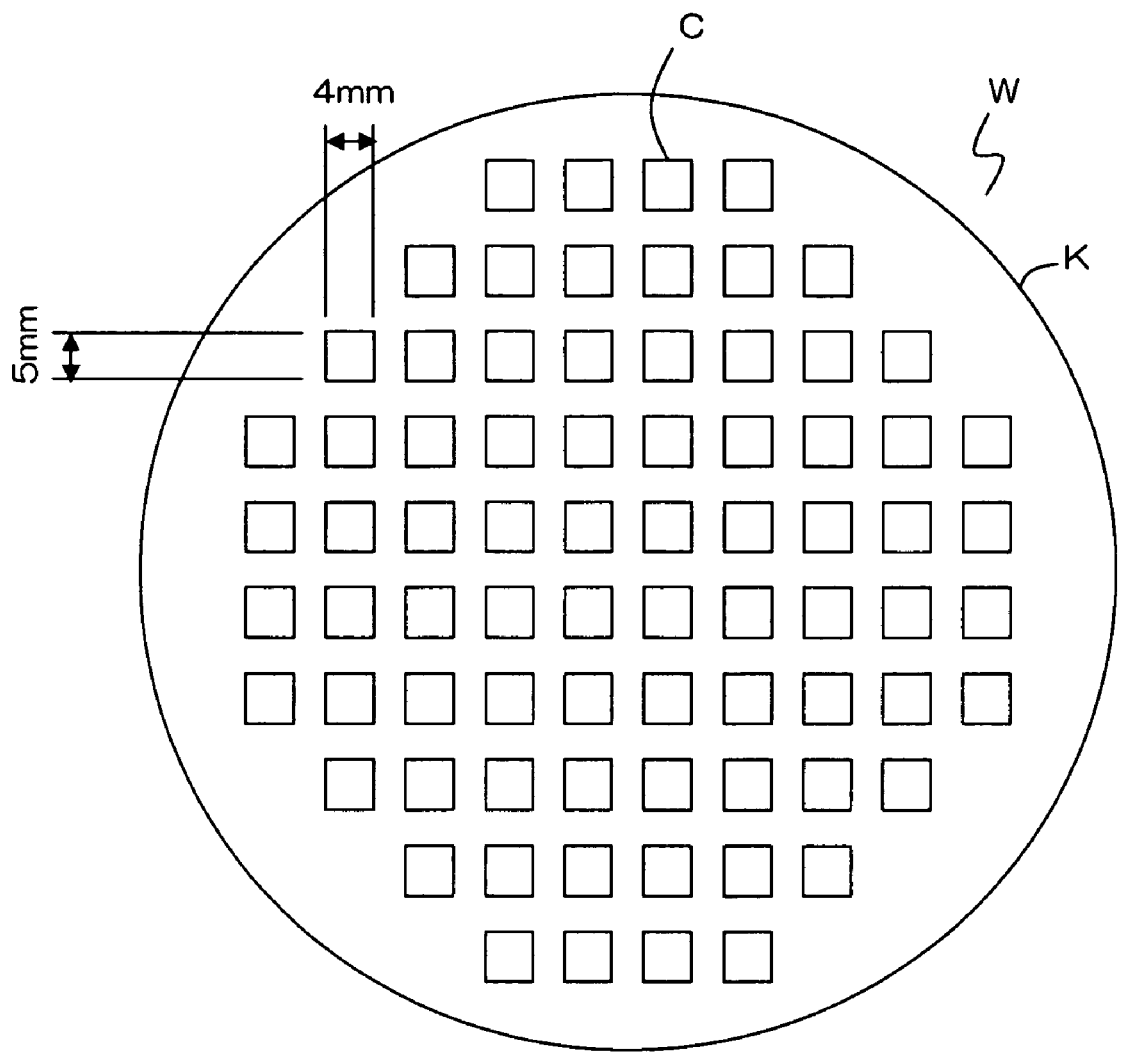
FIG. 2 is a plan view of a wafer.

Next, wafer W is inspected to check for defects for each the succeeding step as needed, and wafers with defects are sorted out. The plan view of a wafer is shown in FIG. 2. Chip portions C are two-dimensionally formed on circular silicon base plate K. Each chip portion C has a dimension of, for example, about 4 mm×5 mm. The base plate may be made of materials other than silicon which are generally used for a wafer, such as gallium arsenide.

(Step 52) Next, wafer W is ground from the opposite side to the side having chip portions C. The thickness of wafer W, which is about 0.65 mm in one example, is decreased by means of, for example, mechanical polishing, and finally to 0.1 mm or less, or about 0.05 mm in another example, by means of chemical etching.

Figure 3A:
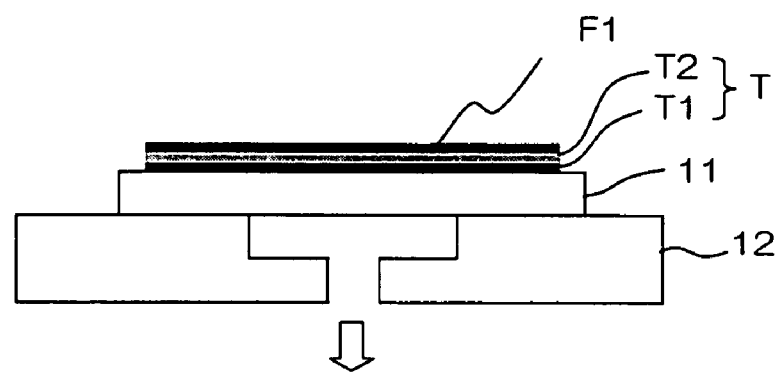
FIGS. 3A-3C are diagrams showing the steps for forming a protection sheet on a wafer.

(Step 53) Next, protection sheet F2 is formed on wafer W in preparation for dicing of wafer W. First, as shown in FIG. 3A, dicing base 11 is tightly attached to lower fixing plate 12, with the back side (the side of lower fixing plate 12) of dicing base 11 at a negative pressure. Dicing base 11 functions as a base plate to hold wafer W when the wafer is diced. Next, plastic sheets T1, such as a polyester sheet, is placed on the surface of dicing base 11, and tightly attached to dicing base 11 with the help of the negative pressure. Next, resin film T2, made of ultraviolet curing resin or thermosetting resin (epoxy resin etc.), etc., is applied to plastic sheet T1, using screen printing technology. The stacked structure of plastic sheet T1 and resin film T2 forms processing sheet T for holding wafer W after wafer W is diced. Tension is not applied to processing sheet T at this step.

Next, resin is applied to processing sheet T. High temperature curing resins, such as epoxy-based resin or phenol-based resin, is preferable because of suitable hardness and adhesive strength. However, ultraviolet curing resin, which cures under the irradiation of ultraviolet rays, may also be used. The following explanation is made, taking epoxy resin as an example. The ratio of the hardening agent to base resin may be reduced in order to facilitate the removal of the processing sheet from wafer W at a later step. For example, the ratio of base resin and a hardening agent, which is normally about 100:14, may be reduced to about 100:7. Epoxy-based resin, which is liquid at normal temperature, is uniformly applied on the surface of processing sheet T by means of screen printing, and epoxy resin film F1 is formed. The thickness of epoxy resin film F1 is preferably about 0.03-0.05 mm taking dicing accuracy into consideration, because epoxy resin film F1 is diced to about half the depth of film thickness, as will be described later. However, if dicing accuracy is within specified tolerance, and the film is made of a hard material, such as epoxy, a thickness of about 0.01 mm will be enough. Epoxy resin may be applied to the entire surface of processing sheet T to contact the entire surface of wafer W, or may be applied along the dicing lines of wafer W. In the latter case, the resin is applied in a width of about 2 mm or more along the dicing lines.

Figure 3B:
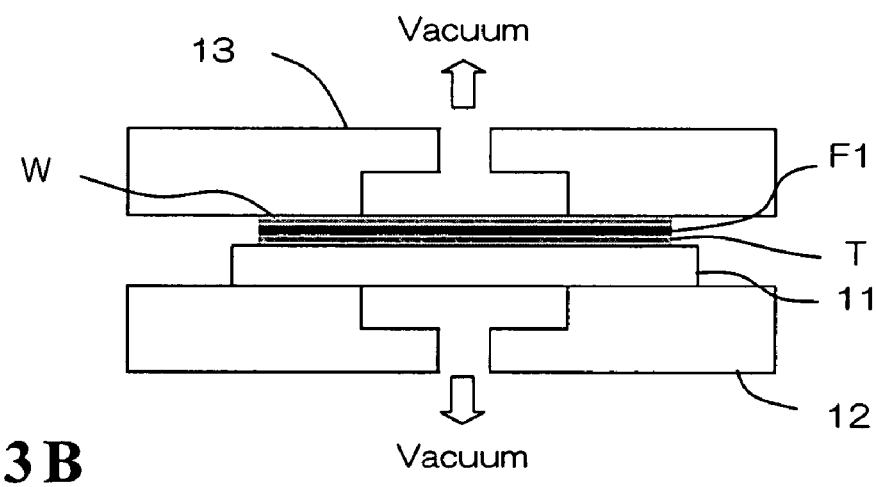

Next, as shown in FIG. 3B, wafer W is tightly held by upper fixing plate 13, with the back side (the side of upper fixing plate 13) at a negative pressure, then upper fixing plate 13 is brought down onto dicing base 11 so that wafer W is tightly attached to epoxy resin film F1. Since wafer W is accurately positioned by upper fixing plate 13, wafer W is uniformly attached to epoxy resin film F1. Next, both fixing plates 12, 13 are removed. Next, the combination of wafer W and dicing base 11 is placed in a high temperature furnace etc. Epoxy resin film F1 is heated and cured at a predetermined temperature for a predetermined time, and protection sheet F2 is formed on the surface of wafer W. In this process, a desired hardness is provided to protection sheet F2 by controlling the heating condition, as will be described later. Protection sheet F2 with a cured resin film stabilizes wafer W during dicing, and as a result, allows stable movement of the grindstone along a straight line. However, the cured state at this step is not the same as the final cured state which would result from a long curing period, but a half-cured state that is the result of the halfway curing process, as will be later described in details.

Figure 3C:
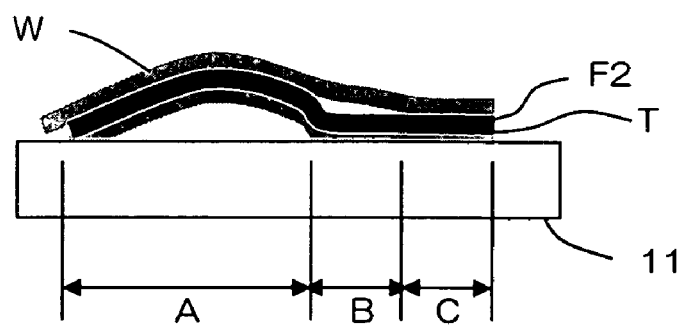

In addition, as shown in FIG. 3C, there may be a gap between protection sheet F2 and wafer W, and/or between protection sheet F2 and dicing base 11. Considering the importance of the adhesion between protection sheet F2 and wafer W for dicing, portion A which has a gap between protection sheet F2 and dicing base 11 can be used, as well as portion C which does not have a gap. However, in order to avoid unstable movement of wafer W during dicing, it is not desirable to use portion B which has a gap between protection sheet F2 and wafer W.

In addition, resin may be applied to wafer W instead of processing sheet T. The procedure in this case is similar to the above explanation, except that the stacked structure of a resin film and wafer W is attached to processing sheet T.

Figure 4A:
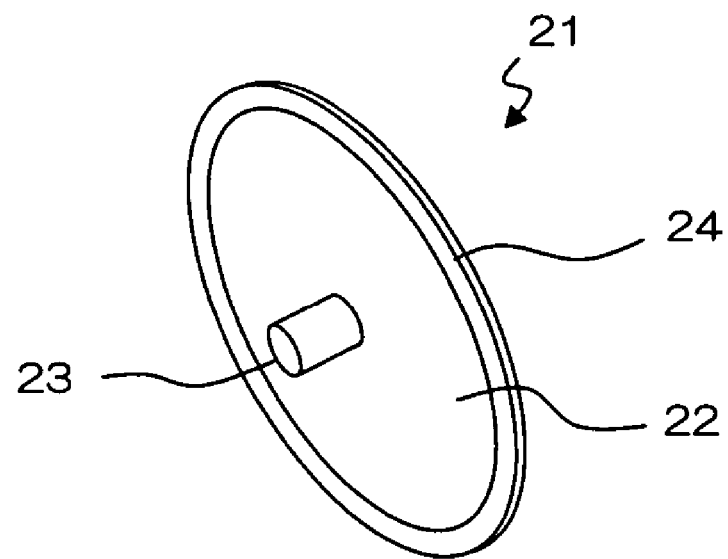
FIG. 4A is a perspective view of a grindstone.
Figure 4B:
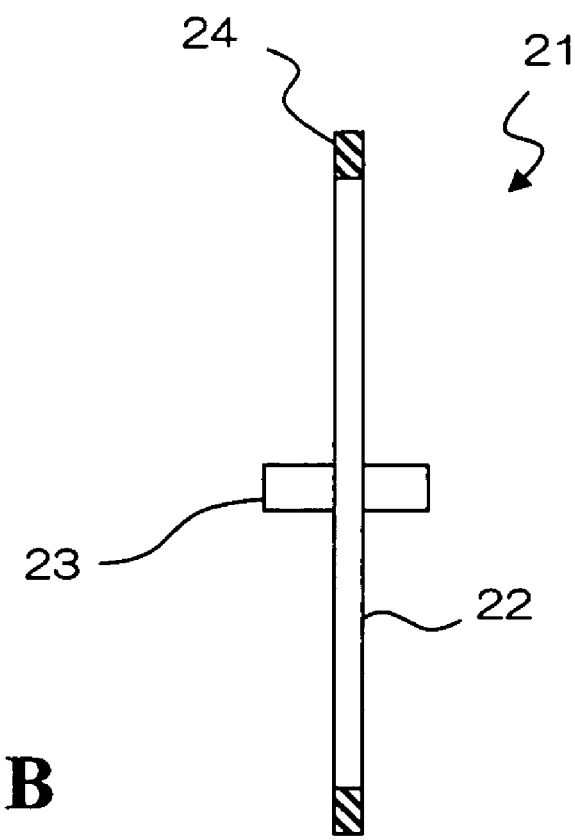
FIG. 4B is a sectional view of a grindstone.

(Step 54) Next, the grindstone that is used to dice wafer W is processed. FIG. 4A shows a perspective view of a grindstone, and FIG. 4B shows a sectional view of the grindstone. Grindstone 21 has dicing portion 24 along the outer circumference of circular core 22 which has rotational shaft 23 in the central portion. Rotational shaft 23 is fixed to a dicing device, not shown, and dicing portion 24 is rotated. Core 22 may be omitted, and the entire portion of grindstone 21 may be made of a material that constitutes dicing portion 24. Grindstone 21 having particles with large diameters and the grain size number of 300s is used. Grindstone 21 is processed in advance as follows, depending on whether grindstone 21 is new (Step 54A), or used (Step 54B).

Figure 5:
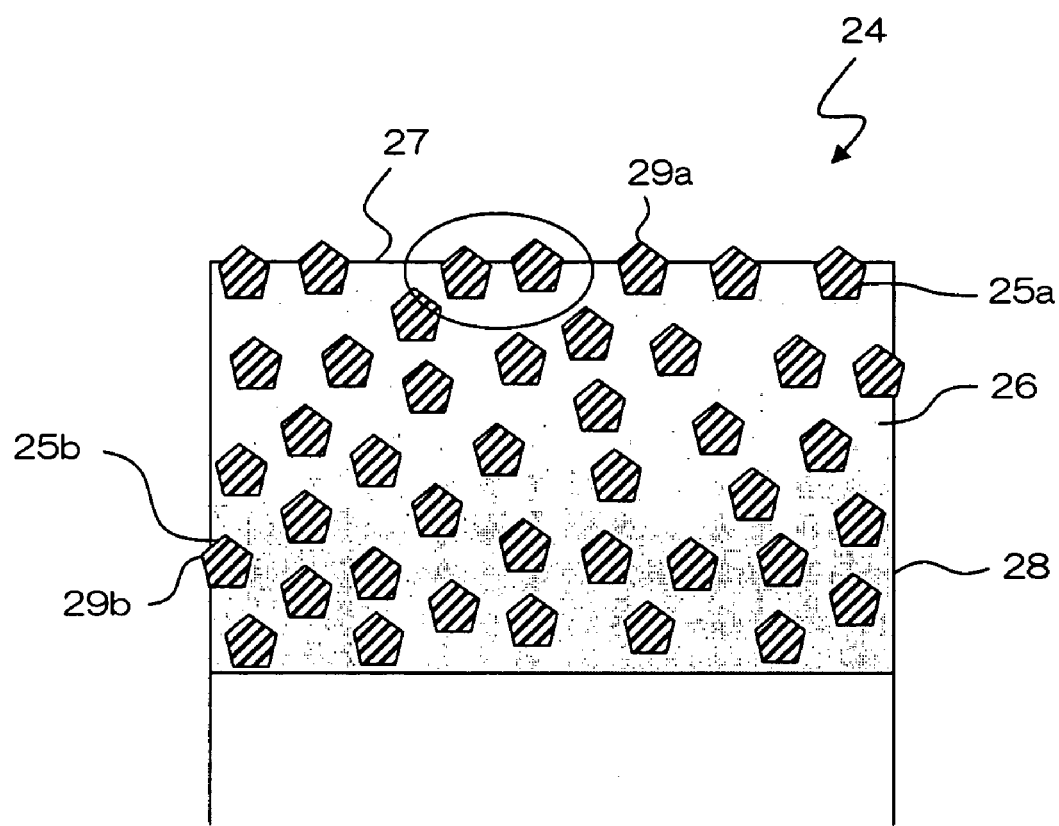
FIG. 5 is a partial sectional view of the dicing portion of the grindstone shown in FIGS. 4A and 4B.
Figure 6A:
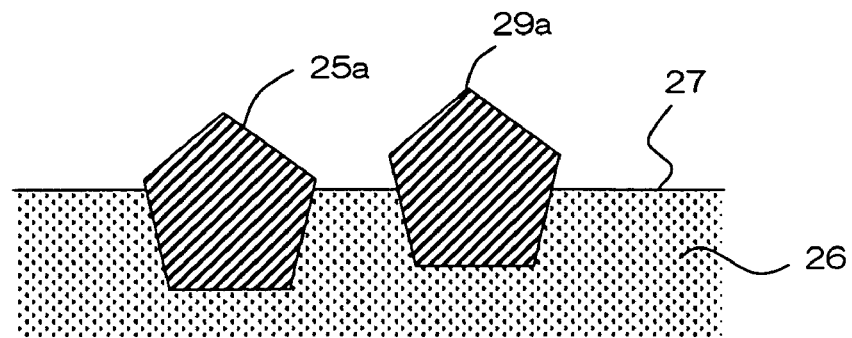
FIGS. 6A-6D are detailed partial sectional views of the dicing portion explaining the steps for processing the grindstone shown in FIGS. 4A and 4B.

(Step 54A) FIG. 5 shows a partial sectional view of the dicing portion of a new grindstone. FIG. 6A shows a partial sectional view of the dicing portion indicated by a circle in FIG. 5. Dicing portion 24 consists of abrasive grains 25, which are made of diamond or green carbon, and binder 26 to bind abrasive grains 25. Binder 26 may be made of, for example, resin or vitrified (sintered) material. Plating type called an electro-casting type may also be used. Abrasive grain 25a which protrudes from outer surface 27, i.e., the outer circumference of the grindstone on which dicing portion 24 faces objects that are to be diced, has sharp edge 29a. The surface of abrasive grains 25a and the surface of binder 26 that is exposed between abrasive grains 25a are in a clean condition. Since sides 28 of dicing portion 24 have been ground fine, usually by the grindstone manufacturer, in order to set the tolerance of grindstone 21 in the width direction, abrasive grains 25b which protrude from sides 28 have small protrusions.

Figure 7:
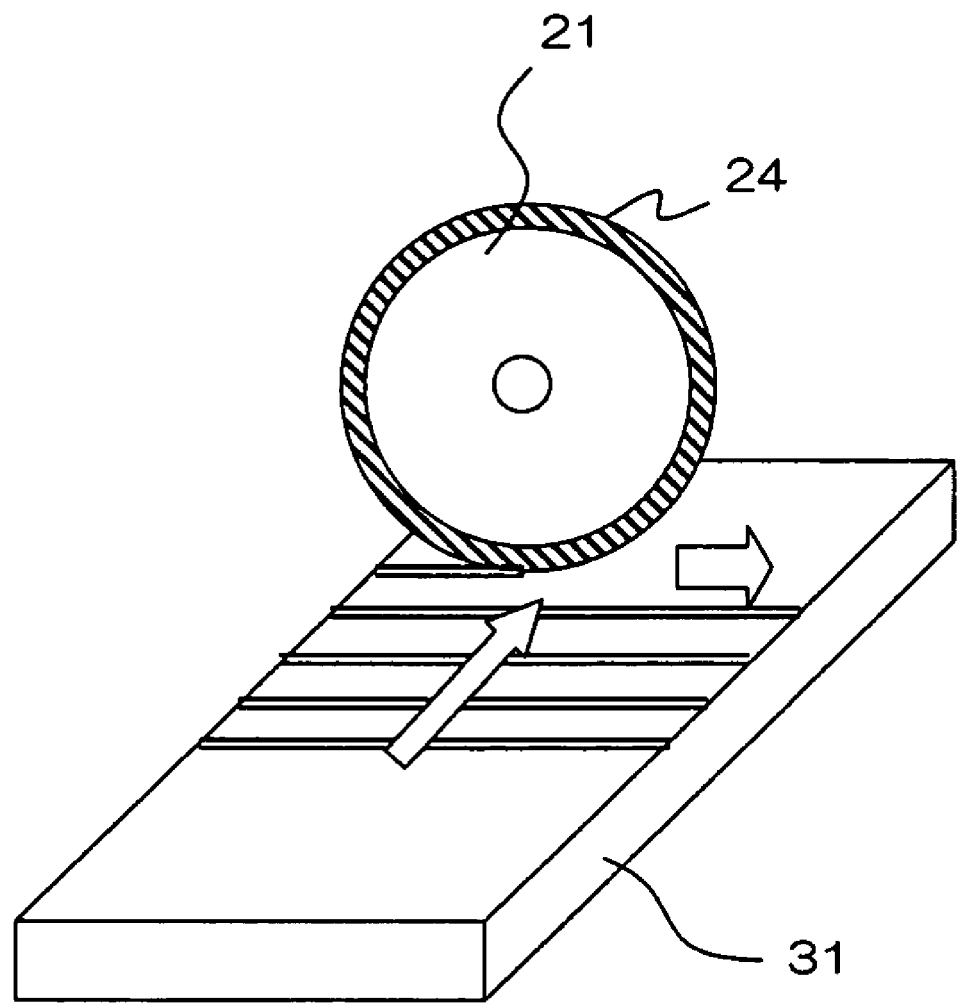
FIG. 7 is a schematic view showing the steps for processing a grindstone.

Next, outer surface 27, as well as sides 28 of grindstone 21, are processed using processing grindstone 31. FIG. 7 shows an exemplary processing method. Dicing portion 24 of grindstone 21 is ground by advancing grindstone 21 along processing grindstone 31, which is in the form of a plate, while grindstone 21 is cutting into processing grindstone 31. There is not much restriction against increased speed. The depth of cutting, which depends on the thickness of wafer W that is to be diced, is preferably sufficiently larger than the thickness of wafer W. By doing so, the area of sides 28 which is in contact with the diced plane of wafer W is also ground well. This operation is repeated about 5 to 10 times as needed.

Figure 6B:
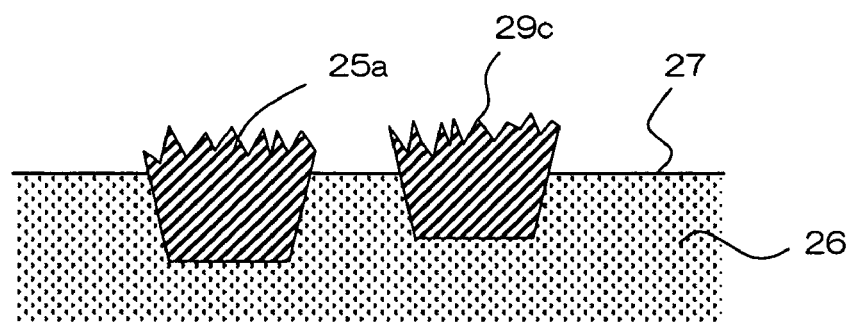

Processing grindstone 31 preferably has smaller particle diameters than abrasive grains 25, and these diameters range, for example, between 0.008-0.012 mm, and the average particle diameter is 0.01 mm. The range of the particle size means the range for most of the abrasive grains. The average particle diameter and the range of particle size may be represented by grain size numbers. The range of the particle diameter and the average particle diameter mentioned above is equivalent to the grain size number of #1500 according to the U.S. standard. Processing grindstone 31 preferably has a hardness that is lower than or equal to that of abrasive grains 25. Specifically, it is desirable that the lower limit of the hardness value is 13 according to the modified Mohr's scale of hardness (equal to the hardness of silicon carbide), and that the upper limit is 14 according to the modified Mohr's scale of hardness (equal to the hardness of boron carbide) if abrasive grain 25 is made of boron carbide, or 15 according to the modified Mohr's scale of hardness (equal to the hardness of diamond) if abrasive grain 25 is made of diamond. The modified Mohr's scale of hardness is a scale of hardness in which the hardness values from 7 to 10 according to the Mohr's scale of hardness are re-classified into values from 7 to 15. Diamond has the largest hardness with the value of 15. The Mohr's scale of hardness is a scale of hardness that is used in the field of minerals. An object is scratched individually by ten minerals each of which has a hardness value starting with 1 for talc and going up to 10 for diamonds, and if the object is flawed, its hardness is judged to be lower than the hardness of the mineral that scratched it (See the 4th edition of Iwanami science dictionary). In addition, the inventor found that abrasive grains with a value of 12 or less, according to the modified Mohr's scale of hardness, have a significantly poor performance at crushing grains. FIG. 6B shows a sectional view of a grindstone in the vicinity of the dicing portion after processing the grindstone under such a condition. As shown in the figure, entire outer surface 27 of grindstone 21 is ground, while edge 29a of abrasive grain 25a is crashed into a plurality of fine edges 29c at the tip of abrasive grain 25a by processing grindstone 31. Consequently, abrasive grain 25a has an increased number of edges that are effective for dicing after the processing step, despite the particle diameter that remains almost unchanged. Moreover, edges 29c are finer than edge 29a that existed before the processing step. Thus, substantially the same effect as would be achieved by increasing the grain size number can be obtained; resulting in reduced resistance against dicing.

In addition, the surfaces of sides 28 are not as much altered as outer surface 27 after the processing step, because originally there are a limited number of abrasive grains 25b on sides 28 of grindstone 21, and each abrasive grain 25b has a small protrusion height. However, it is important to make sides 28 as smooth as possible in order to prevent chipping when a thin wafer is diced. By grinding sides 28 together as mentioned above, the protrusion height of abrasive grains 25b is decreased, and sides 28 with more smooth surfaces can be achieved.

Figure 6C:
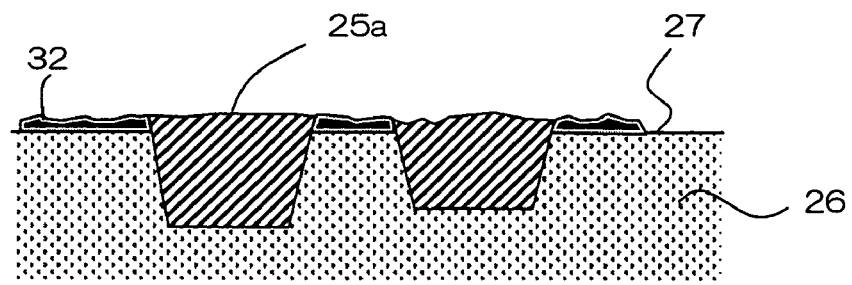
Figure 6D:
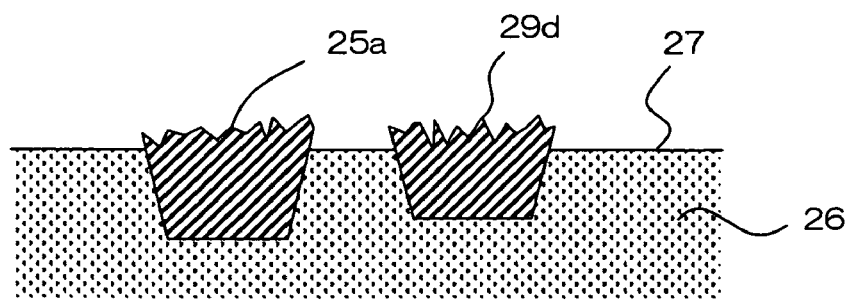

(Step 54B) After grindstone 21 is used for a long time, edges 29c of abrasive grains 25a may wear or may be rounded, or scraps 32 from wafers may be accumulated between abrasive grains 25a, resulting in difficulty in demonstrating the original dicing performance, as shown in FIG. 6C. In this case, a processing step that is similar to step 54A is performed. Abrasive grains 25a are crashed by processing grindstone 31, and a lot of fresh fine edges 29d are formed in the tip portion by having outer surface 27 of grindstone 21 cut deeply into processing grindstone 31. Moreover, scraps 32 which entered between abrasive grains 25a are forced out by the grains of processing grindstone 31 that has smaller particle diameters than abrasive grains 25a. The result is the formation of dicing portion 24 which is substantially the same as the dicing portion formed in step 54A, as shown in FIG. 6D.

(Step 55) Next, wafer W is diced using grindstone 21 that was processed. Specifically, three-layer combined structure 33 consisting of wafer W, protection sheet F2, and processing tape T is diced to halfway the depth of protection sheet F2, with wafer W facing upward. In general, protection sheet F2 is preferably diced to half the depth of the thickness taking dicing accuracy into consideration. However, protection sheet F2 may be diced to a larger depth, as long as processing tape T is not diced. Thus, wafer W is diced and separated into chip portions C, while part of protection sheets F2 and processing tape T are not diced and keep the unity of the wafer. Since dicing plane 24 of grindstone 21 has many fine edges 29c (or 29d) which are formed in the processing step, high speed dicing (for example, about 100 mm/sec) is possible from the beginning without the need for adjustment operation at a low speed.

Figure 8A:
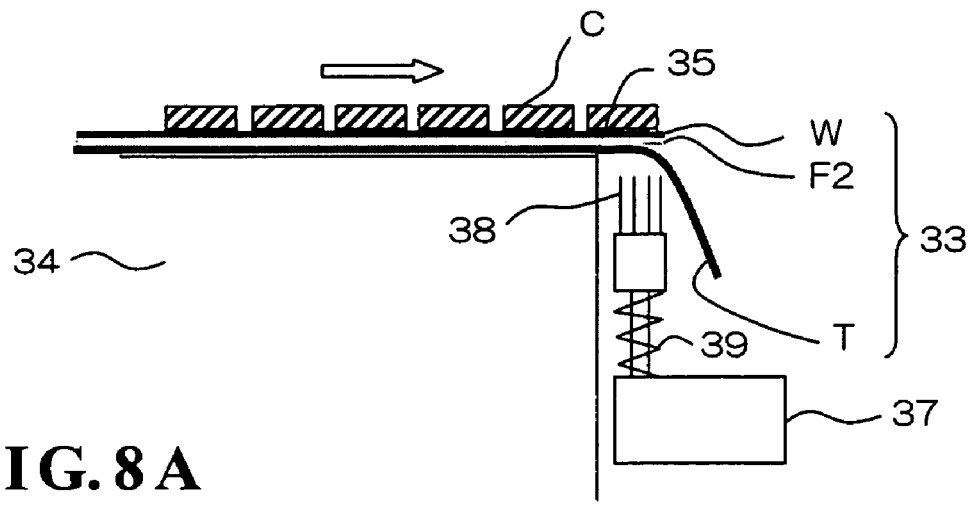
FIGS. 8A-8C are diagrams showing the steps for peeling a processing tape from a wafer.

(Step 56) Next, dicing base 11 is removed from combined structure 33 that was diced. Then, the adhesive strength of resin film T2 is weakened in advance by irradiating with ultraviolet rays if resin film T2 of processing tape T is made of ultraviolet curing resin, or by heating resin film T2 if resin film T2 of processing tape T is made of thermosetting resin. Next, combined structure 33 is forced to slide along supporting stand 34 by a downward force applied to processing tape T, as shown in FIG. 8A. A lot of chip portions C, not shown except for one, are arranged in a line on wafer W in the front-back direction of the figure. Needle assembly 37, which consists of a plurality of needles, is arranged in the vicinity of side wall 36 of supporting stand 34. Needle assembly 37 stands by at a lower position with the help of holding mechanism 38. Processing tape T is bent downward due to the deformability when it passes end portion 35. On the other hand, wafer W and protection sheet F2 begin to be peeled from processing tape T the same way a seal is peeled from a board, because the adhesive strength between processing tape T and protection sheet F2 is weakened compared with that between protection sheet F2 and wafer W, as mentioned above, and further because wafer W and protection sheet F2 cannot follow along with the deformed processing tape T due to the restraint by chip portions C having high rigidity.

Figure 8B:
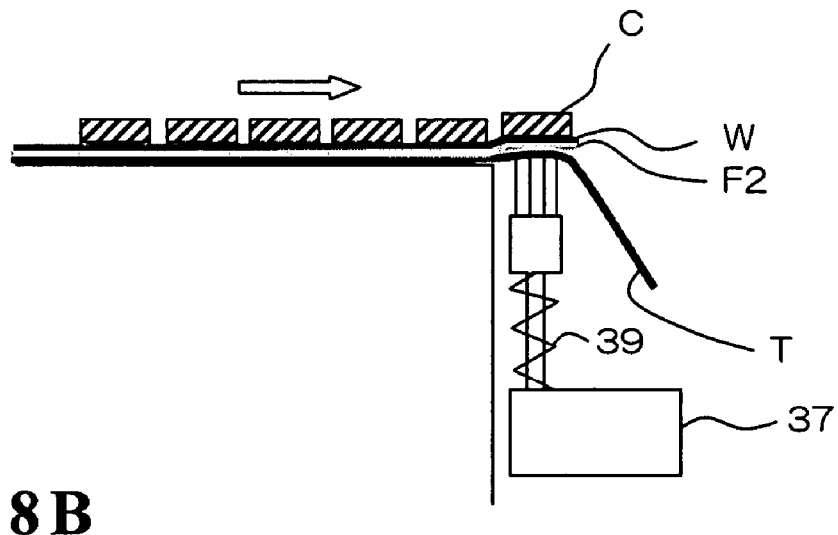

Combined structure 33 is stopped at a position where the peeling progresses to some extent. Then, as shown in FIG. 8B, the holding force of holding mechanism 38 is released, and needle assembly 37 is moved upward to touch processing tape T by the force of spring 39. Consequently, part of processing tape T which is located under chip portions C is lifted, and protection sheet F2 and wafer W are partially peeled. Since protection sheet F2 is already diced part way, the remaining part of protection sheet F2 is diced and peeled together with wafer W. Air that is blown from the tip of a needle may be used instead of touching with a needle, like an injection.

Figure 8C:
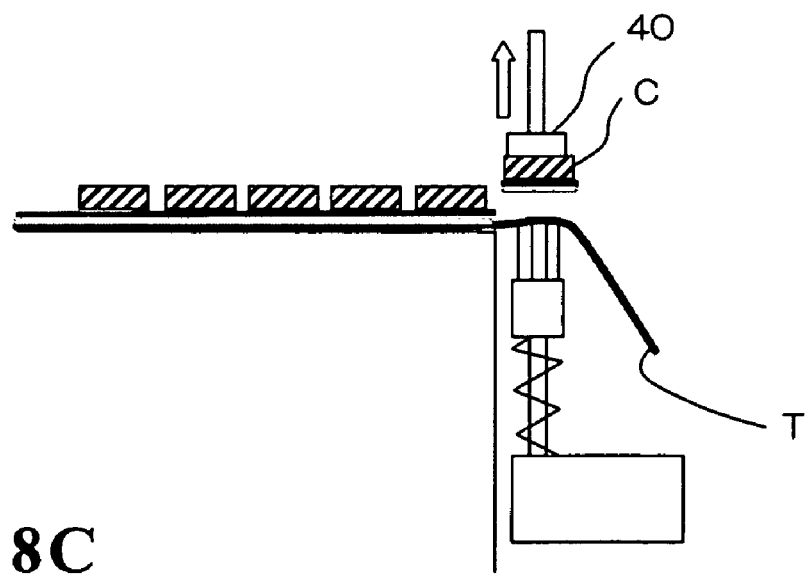

Next, as shown in FIG. 8C, wafer W having protection sheet F2 attached thereon is picked up using vacuum tweezers 40 etc., and thus, wafer W is peeled from processing tape T without being adversely affected.

(Step 57) Next, protection sheet F2 is removed from wafer W through washing. If protection sheet F2 is made of epoxy resin and is in a half-cured state, then an ordinary volatile solvent can be used to wash the resin and to remove protection sheet F2. Moreover, if the ratio of the hardening agent is low as mentioned above, protection sheet F2 can be removed more easily. A similar process can be taken for phenol-based resin, although it is preferable that the cleaning process is performed within 24 hours after the application of resin because the removal of resin becomes more difficult with time.

In accordance with the steps above mentioned, thin wafer W having chip portions thereon can be diced and separated into each chip portion C.

(Step 58) Next, chip portion C is attached to a base plate made of stainless steel in order to assemble an IC chip. Then, the IC chip is washed and visual inspection is conducted.

(Step 59) Next, the finished IC chip is mounted on an antenna circuit board together with an antenna for communication. A protective film is formed on the antenna circuit board in order to cover the IC chip and the antenna. Then, the protective film and the antenna circuit board are covered with a packaging sheet to complete a non-contact type IC card.

Next, the following investigation was performed in order to determine the proper range of hardness of protection sheet F2. First, 700 pieces of chip portions each having a planar size of 4 mm×5 mm were formed on each of the wafers with a thickness of 0.65 mm. Next, protection sheets made of epoxy resin were formed on each of the wafers having chip portions that were cured under conditions A-D shown in Table 1. Similarly, four kinds of conventional processing tapes were applied to the surface of wafers as comparative examples (cases E-H in Table 1).

Next, the hardness of the cured epoxy resin and the processing tapes were measured against the Vickers hardness scale. The Vickers hardness was measured based on the Japanese Industrial Standards Z2244-1981, with an applied load of 0.98 N (100 gf) and a duration of applying load of 30 seconds.

Next, the wafer was fixed to a dicing base that is made of special stainless steel with a thickness of 0.2 mm and with a diameter of 152 mm. Then, the wafer was diced by a grindstone having a grain size number of 2500 and a grindstone width of 0.03 mm. Next, 50 pieces were selected at random from the separated chip portions, and the length and the number of chipping on the front and back sides of the wafer was counted. Chippings having a length of 0.05 mm or more in the width, or the depth, or the thickness direction of the wafer were looked for. As for chipping having lengths less than 0.05 mm, the number of the chipping was counted using a microscope.

The result is shown in Table 1. Judgment was based on the criteria of whether chipping with lengths of 0.05 mm or more were found or not. A chip portion is not affected by chipping with a length of 0.05 mm on an experiential basis. In other words, since a chip portion is usually covered by a protective film, such as a polyimide film, chipping with lengths of 0.05 mm or less hardly affect a chip portion. In cases A-E, no chipping having a length of 0.05 mm or more were found, and the lengths of all the chipping were within 0.03 mm. Moreover, the depths of all the chipping were within 0.01 mm in cases A-D, demonstrating strong resistance against chipping. Case E, in which the depths of the chipping were found to be between 0.01-0.02 mm, also shows a sufficient level for practical use. From the foregoing, the preferable Vickers hardness is 2 or more. In addition, this condition can be satisfied in about 2-3 hours after curing at maximum, though it depends on the temperature condition. It is not necessary to wait until maximum hardness is obtained. On the contrary, taking too much time for curing will result in difficulty in removing a protection sheet from the wafer by washing.

In addition, it is necessary to take not only the hardness of protection sheet F2 but also the adhesive strength to a wafer into consideration in order to determine the curing conditions of protection sheet F2. However, heating at 80 degrees centigrade for about 30 minutes is enough for epoxy-based resin or phenol-based resin, and this condition is covered by the curing conditions to achieve a Vickers hardness of 2 or more.

TABLE 1

| Case | Material | Curing conditions | The Vickers hardness | Result |
|------|----------|-------------------|----------------------|--------|
| A | Epoxy resin | 120 degrees C., 50 minutes | 74.2 | Good |
| B | | 100 degrees C., 30 minutes | 74.2 | Good |
| C | | 80 degrees C., 70 minutes | 74.2 | Good |
| D | | 150 degrees C., 60 minutes | 8.2 | Good |
| E | Processing tape | — | 2.0 | Good |
| F | | — | 0.9 | Not good |
| G | | — | 0.9 | Not good |
| H | | — | 0.7 | Not good |

Figure 9:
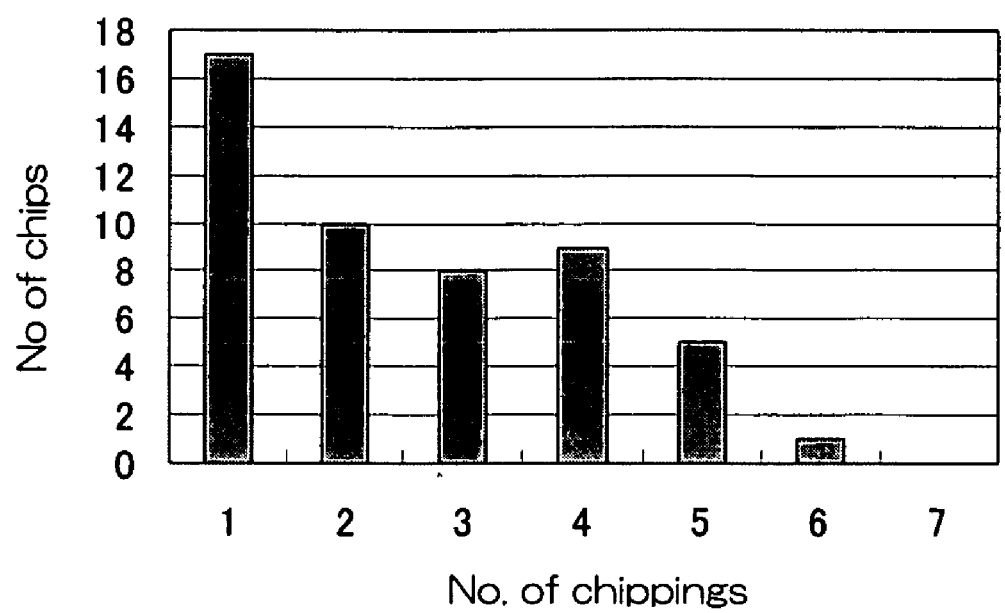
FIG. 9 is a histogram showing the number of chipping.

In addition, the number of chipping which were found was two per chip on average. FIG. 9 shows a histogram of the number of chipping in case C in Table 1. There is small possibility of stress concentration in the base plate because of the limited number of chipping.

Next, the advantage of the present invention was demonstrated based on the following examples. First, in order to verify the effect of processing a grindstone, a grindstone with diamond grains and a grain size number of 360, having a diameter of 55 mm and a width of 0.15 mm was processed by a processing grindstone with green carbon grains and a grain size number of 500, having a thickness of 25 mm, a longer side length of 50 mm, and a shorter side length of 5 mm. The number of revolutions of the grindstone was 30000 rpm, the cutting depth was 0.3 mm, and the moving speed was 10-20 mm/sec. The operation as repeated about 5 to 10 times along the shorter side. As a result, it was confirmed that the tips of large grains were crashed into fine edges in the processing step.

Next, a wafer was diced using the grindstone that was processed in this way. A grindstone with diamond grains and a grain size number of 2500, having a width of 0.03 mm was also used as a comparative example. A silicon wafer with a thickness of 0.05 mm was used. The number of revolutions of the grindstone was 30000 rpm, and the moving speed (dicing speed) was 40 mm/sec. The above-mentioned protection sheet that was made of epoxy resin was formed on the wafer in order to dice the wafer with the processed grindstone, and a processing tape having a comparatively large hardness was applied to the wafer in order to dice the wafer with the grindstone of the comparative example.

As a result, chipping with lengths of 0.01-0.015 mm were generated on the back side (the side on which the elements were not formed), while no chipping were generated on the side on which the elements were formed in the comparative example. When the processed grindstone was used, chipping was generated on both sides. However, the lengths of the chipping were found to be 0.01 mm or less. Moreover, particles of the grindstone stuck to the cutting plane, and the cutting plane was discolored to some extent in the comparative example, whereas no such phenomenon was found in the processed grindstone, and the original color of the wafer remained unchanged. In this way, it was demonstrated that the present invention achieves a dicing performance as high as can be obtained by a grindstone with a grain size number of 2000s (For instance, the grain size number #2500 according to the U.S. standard corresponds to the average particle diameter of 0.006 mm and the particle size range of 0.004-0.008 mm.) The advantages of the present invention can be summarized as follows.

First, since a protection sheet, which hardness is high, is attached to a thin wafer in order to stabilize the wafer prior to dicing the wafer into chip portions, the possibility of chipping can be reduced, resulting in improved reliability of IC chips. In addition, in the conventional processing tape, tension was applied to a plastic sheet, which serves as the base material of a processing tape, in order to improve the flatness of the contact plane with a wafer, whereas, according to the present invention, the need to apply tension is reduced due to an additionally formed protection sheet having large hardness. Consequently, the fluctuation of dicing lines during dicing, which is caused by the shrinkage of the processing tape, is prevented, and the wafer is further stabilized.

Furthermore, a lot of fine edges are formed on a grindstone having large particle diameters for dicing a wafer, because the grindstone is processed by a processing grindstone in advance, resulting in an effect as good as can be achieved by a grindstone having a small particle diameter. Since a grindstone with small particle diameters is generally expensive, the economical advantage is large. In addition, since grains with large particle diameters are firmly held by binder due to the large contact area with the binder, the possibility that grains come off is reduced, resulting in a grindstone that has a longer life.

Furthermore, processing a grindstone in the above-mentioned manner does away with the need for an adjustment operation at a low dicing speed, and allows dicing of wafers at a predetermined dicing speed from the beginning, leading to an improvement in working efficiency with less effort for adjustments and less time for dicing.

In addition, the method for dicing a wafer according to the present invention is useful especially for a wafer having a thickness of 0.1 mm or less. However, there is a possibility of chipping in wafers having larger thicknesses because of the general nature of high brittleness of wafer materials, as long as similar methods to dice a wafer are used. Therefore, the method for dicing a wafer according to the present invention is useful also for a wafer with a thickness more than 0.1 mm.

Although a certain preferred embodiment of the present invention has been shown and described in detail, it should be understood that various changes and modifications may be made without departing from the spirit or scope of the appended claims.

What is claimed is:

1. A method for dicing a wafer comprising the steps of:
   reducing a thickness of a wafer to at least 0.1 mm or less;
   forming a protection sheet tightly on one side of said wafer, said protection sheet having a Vickers hardness of 2 or more; and
   dicing said wafer by a grindstone, said wafer having said protection sheet thereon.

2. The method for dicing a wafer according to claim 1, wherein, said step for forming the protection sheet comprises the steps of:
   applying a film which consists of thermosetting resin tightly on said wafer; and
   heating and curing said film to obtain said protection sheet, said film being tightly applied.

3. The method for dicing a wafer according to claim 2, wherein, said step for applying the film comprises the steps of:
   applying said film which consists of thermosetting resin on a processing tape, said processing tape having a stacked structure consisting of a base material and a resin film, wherein said film which consists of thermosetting resin is applied on the resin film; and applying said film which consists of thermosetting resin on said wafer, said film being formed on said processing tape.

4. The method for dicing a wafer according to claim 2, wherein, said step for applying the film comprises the steps of:

forming the film which consists of thermosetting resin on said wafer: and attaching said wafer to a processing tape having a stacked structure consisting of a base material and a resin film, said wafer having said film which consists of thermosetting resin formed thereon, wherein a side of said wafer on which the film which consists of the thermosetting resin is formed and a side of said processing tape on which the resin film is formed are tightly attached.

5. The method for dicing a wafer according to claim 3, wherein, no tension is applied to said processing tape in said step for applying the film.

6. The method for dicing a wafer according to claim 2, wherein, said thermosetting resin is epoxy resin.

7. The method for dicing a wafer according to claim 1, wherein, said step for forming the protection sheet comprises the steps of:

applying a film which consists of ultraviolet curing resin tightly to said wafer; and irradiating with ultraviolet rays and curing said film to obtain said protection sheet, said film being tightly applied.

8. The method for dicing a wafer according to claim 7, wherein, said step for applying the film comprises the steps of:

applying said film which consists of ultraviolet curing resin on a processing tape, said processing tape having a stacked structure consisting of a base material and a resin film, wherein said film which consists of ultraviolet curing resin is applied on the resin film; and applying said film which consists of ultraviolet curing resin on said wafer, said film being formed on said processing tape.

9. The method for dicing a wafer according to claim 7, wherein, said step for applying the film comprises the steps of:

forming the film which consists of ultraviolet curing resin on said wafer: and attaching said wafer to a processing tape having a stacked structure consisting of a base material and a resin film, said wafer having said film which consists of ultraviolet curing resin formed thereon, wherein a side of said wafer on which the film which consists of the ultraviolet curing resin is formed and a side of said processing tape on which the resin film is formed are tightly attached.

10. The method for dicing a wafer according to claim 8, wherein, no tension is applied to said processing tape in said step for applying the film.

11. The method for dicing a wafer according to claim 1, further comprising the step of processing the grindstone by a processing grindstone prior to said step for dicing said wafer, wherein said processing grindstone has grains having particle diameters which are smaller than those of the grindstone, and having a hardness which is equal to or lower than that of the grindstone.

12. The method for dicing a wafer according to claim 11, wherein, said processing grindstone has grains having particle diameters which are 0.01 mm on average and range between 0.008-0.012 mm, and having a hardness which is 13 or more according to modified Mohr's scale of hardness.

* * * * *